(12) United States Patent
Saito

(10) Patent No.: US 8,653,477 B2
(45) Date of Patent: Feb. 18, 2014

(54) LITHOGRAPHY APPARATUS AND LITHOGRAPHY METHOD

(75) Inventor: Hiroyasu Saito, Shizuoka (JP)

(73) Assignee: NuFlare Technology, Inc., Numazu-shi (JP)

( * ) Notice: Subject to any disclaimer, the term of this patent is extended or adjusted under 35 U.S.C. 154(b) by 162 days.

(21) Appl. No.: 12/706,049

(22) Filed: Feb. 16, 2010

(65) Prior Publication Data

US 2010/0238420 A1 Sep. 23, 2010

(30) Foreign Application Priority Data

Mar. 18, 2009 (JP) .................................. 2009-065599

(51) Int. Cl.
*G03B 27/42* (2006.01)

(52) U.S. Cl.
USPC ............... 250/441.11; 250/492.1; 250/442.11

(58) Field of Classification Search
USPC .................... 250/491.1, 492.1–492.3, 442.11, 250/441.11; 414/217
See application file for complete search history.

(56) References Cited

U.S. PATENT DOCUMENTS

| | | | | |
|---|---|---|---|---|
| 3,433,923 A * | 3/1969 | McNabb | ................. | 219/121.13 |
| 3,745,320 A * | 7/1973 | Baumgartner et al. | .. | 219/121.21 |
| 4,155,692 A * | 5/1979 | Kermoian | ................. | 425/292 |
| 4,256,444 A * | 3/1981 | Suter | ................. | 425/73 |
| 4,625,627 A * | 12/1986 | Livanos et al. | ................. | 454/237 |
| 4,722,654 A * | 2/1988 | Norton | ................. | 414/217 |
| 4,902,023 A * | 2/1990 | Opresko et al. | ................. | 277/628 |
| 5,411,358 A * | 5/1995 | Garric et al. | ................. | 414/277 |
| 5,687,947 A * | 11/1997 | Iwamoto et al. | ................. | 248/612 |
| 6,208,408 B1 * | 3/2001 | Takabayashi | ................. | 355/67 |
| 6,371,846 B1 * | 4/2002 | Powell et al. | ................. | 454/271 |
| 6,382,457 B1 * | 5/2002 | Bernard et al. | ................. | 220/651 |
| 6,450,631 B1 * | 9/2002 | Hayashi et al. | ................. | 347/86 |
| 6,949,204 B1 * | 9/2005 | Lenz et al. | ................. | 216/67 |
| 7,024,823 B2 * | 4/2006 | Keller | ................. | 49/399 |
| 7,147,719 B2 * | 12/2006 | Welch et al. | ................. | 118/715 |
| 7,361,905 B2 * | 4/2008 | Tanaka et al. | ................. | 250/442.11 |
| 7,411,655 B2 * | 8/2008 | Kasumi | ................. | 355/53 |
| 7,782,444 B2 * | 8/2010 | Kimura | ................. | 355/72 |
| 7,845,891 B2 * | 12/2010 | Lee et al. | ................. | 414/217 |
| 7,923,704 B2 * | 4/2011 | Sunaoshi | ................. | 250/492.23 |
| 7,948,603 B2 * | 5/2011 | Tanaka | ................. | 355/30 |

(Continued)

FOREIGN PATENT DOCUMENTS

| | | |
|---|---|---|
| JP | 7-211612 | 8/1995 |
| JP | 2003-68609 A | 3/2003 |
| JP | 2004-311893 A | 11/2004 |

OTHER PUBLICATIONS

Office Action issued Mar. 5, 2013 in Japanese Patent Application No. 2009-065599 with English language translation.

*Primary Examiner* — David A Vanore
*Assistant Examiner* — Wyatt Stoffa
(74) *Attorney, Agent, or Firm* — Oblon, Spivak, McClelland, Maier & Neustadt, L.L.P.

(57) ABSTRACT

A lithography apparatus includes a stage on which a target object is placed; a chamber in which the stage is arranged and which has one side surface in which an opening having a size which is enough to carry the stage in or out is formed, the opening being closed with an independent lid; an electro-optic lens barrel arranged on the chamber; and a rib portion formed to have a shape that is convex on an upper portion of the side surface of the chamber in which the opening is formed.

18 Claims, 8 Drawing Sheets

(56) References Cited

U.S. PATENT DOCUMENTS

| | | | |
|---|---|---|---|
| 2002/0050689 A1* | 5/2002 | Crawford | 277/608 |
| 2002/0061245 A1* | 5/2002 | Hasegawa et al. | 414/217 |
| 2003/0043357 A1 | 3/2003 | Shimoda | |
| 2003/0071231 A1* | 4/2003 | Haraguchi et al. | 250/492.22 |
| 2003/0095862 A1* | 5/2003 | Kawanishi et al. | 415/90 |
| 2004/0013501 A1* | 1/2004 | Ackeret et al. | 414/217 |
| 2004/0169832 A1* | 9/2004 | Shimoda | 355/30 |
| 2004/0187781 A1* | 9/2004 | Takahashi | 118/715 |
| 2004/0265167 A1* | 12/2004 | Morrison | 422/33 |
| 2005/0053456 A1* | 3/2005 | Ackeret et al. | 414/935 |
| 2006/0032736 A1* | 2/2006 | Lenz et al. | 204/192.1 |
| 2006/0060259 A1* | 3/2006 | Devitt | 141/65 |
| 2006/0138343 A1* | 6/2006 | Nakasuji et al. | 250/440.11 |
| 2006/0215145 A1* | 9/2006 | Kubo | 355/72 |
| 2007/0045573 A1* | 3/2007 | Kleinschmidt et al. | 250/504 R |
| 2007/0166133 A1* | 7/2007 | Lee et al. | 414/217 |
| 2007/0211613 A1* | 9/2007 | Murayama | 369/272.1 |
| 2008/0170210 A1* | 7/2008 | Meijer et al. | 355/30 |
| 2008/0297751 A1* | 12/2008 | Shibazaki | 355/53 |
| 2008/0302963 A1* | 12/2008 | Nakasuji et al. | 250/310 |
| 2009/0001293 A1* | 1/2009 | Sunaoshi | 250/492.22 |
| 2009/0050822 A1* | 2/2009 | Nakasuji et al. | 250/492.2 |
| 2009/0059190 A1* | 3/2009 | Tanaka et al. | 355/30 |
| 2009/0092484 A1* | 4/2009 | Zipp | 415/171.1 |
| 2009/0129897 A1* | 5/2009 | Babbs et al. | 414/217 |
| 2009/0244670 A1* | 10/2009 | Sato et al. | 359/205.1 |
| 2009/0259431 A1* | 10/2009 | Yoshitake | 702/150 |
| 2009/0296065 A1* | 12/2009 | Cloin et al. | 355/71 |
| 2010/0073653 A1* | 3/2010 | Shibazaki | 355/53 |
| 2010/0090573 A1* | 4/2010 | Ko | 312/326 |
| 2010/0098518 A1* | 4/2010 | Nguyen et al. | 414/217 |
| 2010/0171941 A1* | 7/2010 | Shibazaki | 355/71 |
| 2010/0236194 A1* | 9/2010 | McLaughlin et al. | 53/432 |
| 2010/0238420 A1* | 9/2010 | Saito | 355/53 |
| 2010/0309446 A1* | 12/2010 | Manini et al. | 355/30 |
| 2011/0008136 A1* | 1/2011 | Bufano et al. | 414/217 |
| 2011/0024623 A1* | 2/2011 | Hatakeyama et al. | 250/310 |
| 2011/0049393 A1* | 3/2011 | De Boer et al. | 250/492.2 |
| 2011/0058147 A1* | 3/2011 | Ehm et al. | 355/30 |
| 2011/0168925 A1* | 7/2011 | Ceglio et al. | 250/504 R |
| 2012/0155994 A1* | 6/2012 | Kishimoto et al. | 414/217 |

* cited by examiner

US 8,653,477 B2

LITHOGRAPHY APPARATUS AND LITHOGRAPHY METHOD

CROSS-REFERENCE TO RELATED APPLICATION

This application is based upon and claims the benefit of priority from prior Japanese Patent Application No. 2009-065599 filed on Mar. 18, 2009 in Japan, the entire contents of which are incorporated herein by reference.

BACKGROUND OF THE INVENTION

1. Field of the Invention

The present invention relates to a lithography apparatus and a lithography method and, in particular, to a lithography apparatus and a lithography method for forming patterns by using electron beams in a vacuum state.

2. Related Art

A photolithography technique which takes a part of the development of miniaturization of semiconductor devices is only a process, in which a pattern is generated, in semiconductor manufacturing processes and is very important. In recent years, with the advancement in integration density of an LSI, circuit line widths required for semiconductor devices are miniaturized year by year. In order to form desired circuit patterns on the semiconductor devices, precise original patterns (to be also referred to as a reticle or a mask) are required. In this case, an electron beam writing technique has an essentially excellent resolution, and is used in production of precise original patterns.

FIG. 10 is a conceptual diagram for explaining an operation of a variable-shaped electron beam lithography apparatus. The variable-shaped electron beam lithography apparatus operates as follows. An oblong, for example, rectangular opening 411 to shape an electron beam 330 is formed in a first aperture plate 410. A variable-shaped opening 421 to shape the electron beam 330 having passed through the opening 411 of the first aperture plate 410 into a desired oblong shape is formed in a second aperture plate 420. The electron beam 330 irradiated from the charged particle source 430 and having passed through the opening 411 of the first aperture plate 410 is deflected by a deflector, passes through a part of the variable-shaped opening 421 of the second aperture plate 420, and is irradiated on a target object 340 placed on a stage continuously moving in one predetermined direction (for example, an X direction). More specifically, an oblong shape which can pass through both the opening 411 of the first aperture plate 410 and the variable-shaped opening 421 of the second aperture plate 420 is written in a write region of the target object 340 placed on the stage continuously moving in the X direction. A scheme which causes an electron beam to pass through both the opening 411 of the first aperture plate 410 and the variable-shaped opening 421 of the second aperture plate 420 to form an arbitrary shape is a variable-shaping scheme.

FIG. 11 is a conceptual diagram showing a housing configuration of the lithography apparatus. In FIG. 11, in the electron beam lithography apparatus, a stage 305 on which a target object 301 is placed is accommodated in a write chamber 303. On the write chamber 303, an electro-optic lens barrel 302 on which the electro-optic system described above is mounted is arranged. In a writing operation, the electro-optic lens barrel 302 and the write chamber 303 are vacuumed by a vacuum pump 310, and a pattern is formed on the target object 301 in vacuum. In this case, in order to install, remove, or check the stage 305 in the write chamber 303, an opening 320 having a size which is enough to carry the stage 305 in or out. While the electro-optic lens barrel 302 and the write chamber 303 are vacuumed, the opening 320 is closed by a door 331. The door 331 can be opened and closed, and is fixed to a side surface with a screw or the like.

In this case, when the inside and outside of the write chamber 303 are in an atmospheric pressure, any problem is not posed. However, since a pressure difference occurs in the inside and outside of the write chamber 303 when the write chamber 303 is set in a vacuum state, a circumferential surface of the write chamber 303 is deformed. At this time, since the rigidity of a side surface in which the opening 320 is formed and the rigidity of a side surface in which the opening 320 is not formed are different from each other, amounts of deformation are different from each other to tilt the electro-optic lens barrel 302 to a side of the low-rigidity side surface in which the opening 320 is formed. When the electro-optic lens barrel 302 is tilted, the trace of an electron beam is misaligned to disadvantageously cause an error in size of a pattern to be formed. In particular, an amount of deformation of the write chamber 303 changes depending on a variation in atmosphere. For this reason, an angle θ at which the electro-optic lens barrel 302 is tilted changes depending on a variation in atmosphere, and an error of a write position changes accordingly. In particular, a higher pattern-forming accuracy is required with miniaturization of a circuit line width in recent years, and thus deterioration in pattern-forming accuracy caused by positional misalignment by a variation in atmosphere is not negligible. In a conventionally, this problem is addressed by correcting a deflection position of an electron beam. However, this correction cannot be easily performed when an amount of deformation becomes large.

A technique (for example, see Japanese Unexamined Patent Publication No. 7-211612) which calculates an amount of field distortion caused by a variation in atmosphere by a projection optical system which exposes a mask image on a wafer to move a stage to an appropriate position is disclosed in a document.

As described above, the angle by which the electro-optic lens barrel is tilted on the weak side surface side on which the opening is formed changes depending on a variation in atmosphere, and an error in size of a pattern to be formed occurs disadvantageously. For this reason, a small tilt angle is desired, however, a measure for the small tilt angle has not been made.

BRIEF SUMMARY OF THE INVENTION

It is an object of an embodiment of the present invention to provide a lithography apparatus and a lithography method which can make a tilt angle of an electro-optic lens barrel used in a vacuum state smaller.

In accordance with one aspect of the present invention, a lithography apparatus includes a stage on which a target object is placed; a chamber in which the stage is arranged and which has one side surface in which an opening having a size which is enough to carry the stage in or out is formed, the opening being closed with an independent lid; an electro-optic lens barrel arranged on the chamber; and a rib portion formed to have a shape that is convex on an upper portion of the side surface of the chamber in which the opening is formed.

In accordance with another aspect of the present invention, a lithography method includes controlling to be a vacuum state in a chamber having a side surface in which an opening is formed, the side surface being reinforced by a rib portion, and an electro-optic lens barrel arranged on the chamber; and irradiating a charged particle beam from the electro-optic lens barrel to a target object placed on a stage arranged in the chamber in the vacuum state to form a pattern.

DETAILED DESCRIPTION OF THE INVENTION

Embodiment 1

In an embodiment, a configuration using an electron beam as an example of a charged particle beam will be described below. The charged particle beam is not limited to an electron beam, and a beam such as an ion beam using charged particles may be used.

Figure 1:
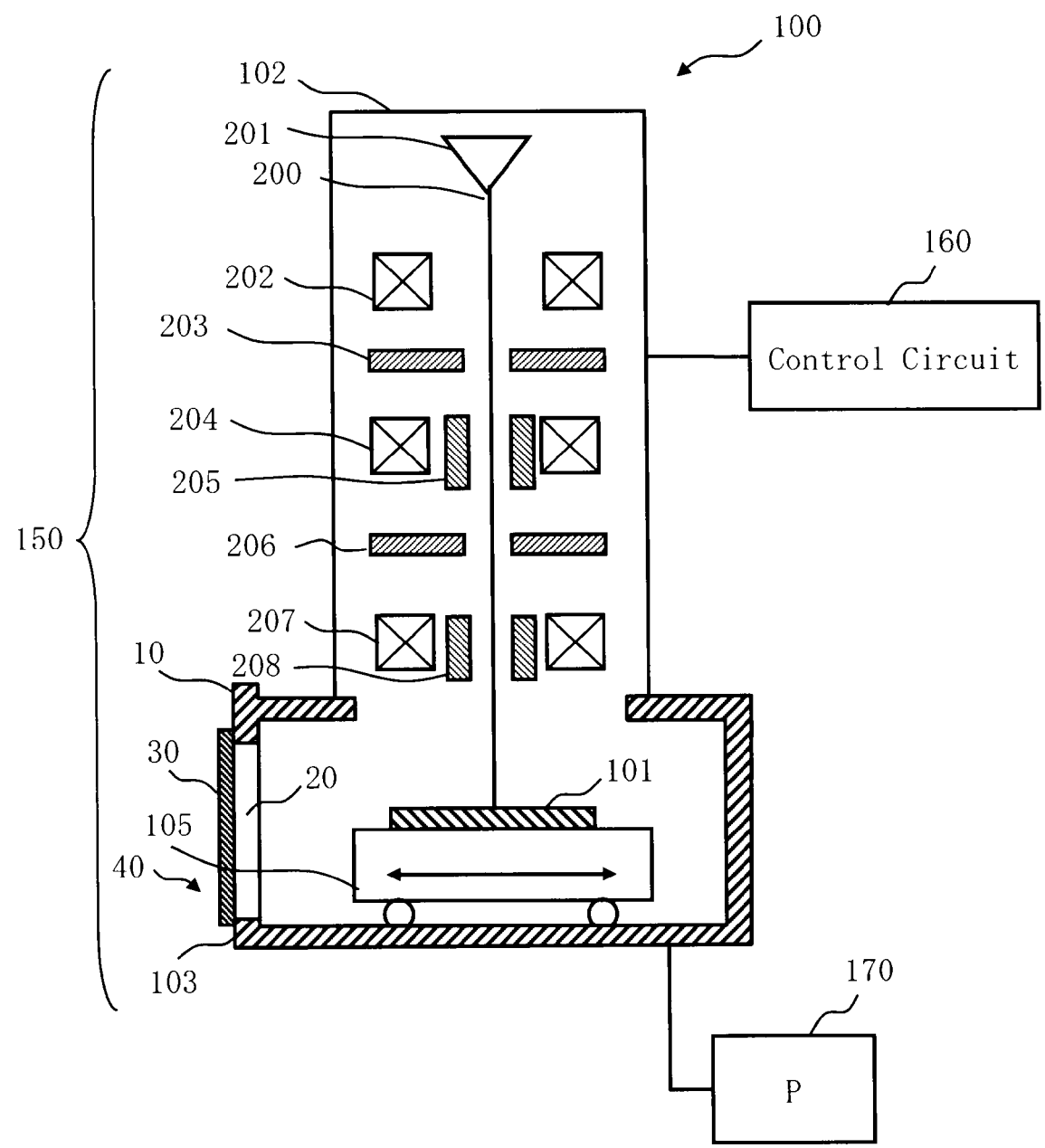
FIG. 1 is a conceptual diagram showing a configuration of a lithography apparatus according to Embodiment 1.

FIG. 1 is a conceptual diagram showing a configuration of a lithography apparatus according to Embodiment 1. In FIG. 1, a lithography apparatus 100 includes a write unit 150 and a control circuit 160. The lithography apparatus 100 forms a pattern on a target object 101 on which a resist is coated by using an electron beam 200. The write unit 150 has an electro-optic lens barrel 102 and a writing chamber 103. The electro-optic lens barrel 102 is arranged on the writing chamber 103.

In the electro-optic lens barrel 102, an electron gun assembly 201, an illumination lens 202, a first aperture plate 203, a projection lens 204, a deflector 205, a second aperture plate 206, an objective lens 207, and a deflector 208. In the writing chamber 103, an X-Y stage 105 is arranged. On the X-Y stage 105, the target object 101 serving as an object on which a pattern is to be formed is placed. The target object 101 includes a mask substrate, a wafer, or the like.

The write unit 150 is controlled by the control circuit 160. In a wiring operation, the electro-optic lens barrel 102 and the writing chamber 103 are controlled to be a vacuum state by exhausting in the electro-optic lens barrel 102 and the writing chamber 103 by a vacuum pump 170. In order to install, remove, or check the X-Y stage 105 in the writing chamber 103, an opening 20 having a size which is enough to carry the X-Y stage 105 in or out is formed in one side surface of the writing chamber 103. While the writing chamber 103 is vacuumed, the opening 20 is closed with a door 30 that is an independent lid. The door 30 can be opened and closed and is fixed to the side surface with a screw or the like.

Figure 2:
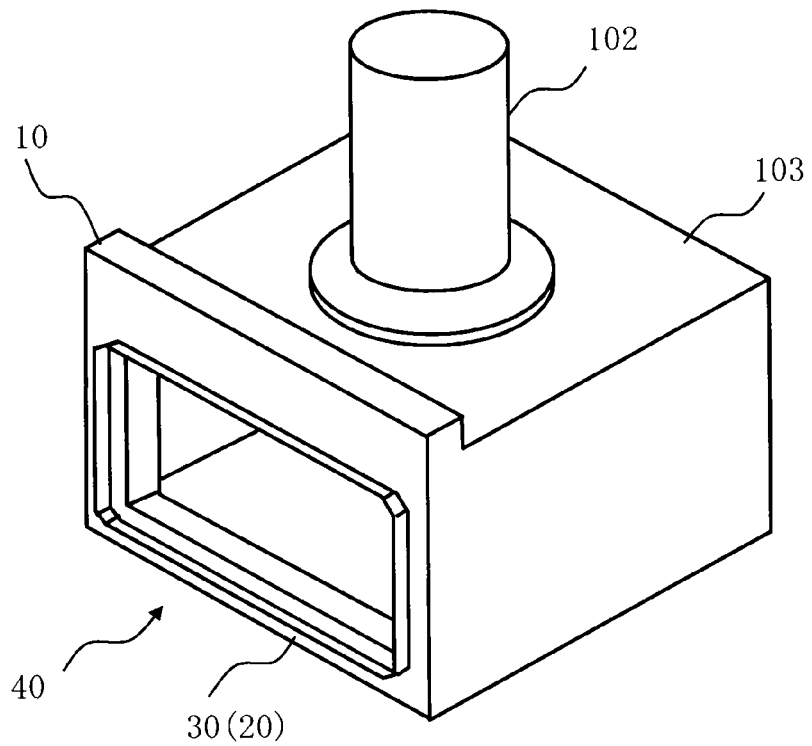
FIG. 2 is an appearance diagram of the lithography apparatus according to Embodiment 1.

FIG. 2 is an appearance diagram of the lithography apparatus according to Embodiment 1. On one surface of the circumferential surfaces of the writing chamber 103, as described above, the opening 20 having a size which is enough to carry the X-Y stage 105 in or out is formed. For this reason, in this state, the rigidity or "hardness" of a side surface 40 in which the opening 20 is formed is lower than that of a side surface in which the opening 20 is not formed. Therefore, in Embodiment 1, a rib portion 10 formed to have a convex shape is formed on an upper part of the side surface 40 of the writing chamber 103 in which the opening 20 is formed. The circumferential surfaces of the writing chamber 103, for example, are integrally formed by fixing plate-like members by welding. The rib portion 10 is formed integrally with the writing chamber 103. When an upper part of the side surface of the writing chamber 103 in which the opening 20 is formed is reinforced by the rib portion 10, the rigidity of the side surface of the writing chamber 103 in which the opening 20 is formed can be improved. The size of the rib portion 10 is arbitrarily adjusted to make it possible to make the rigidity of the side surface of the writing chamber 103 in which the opening 20 is formed equal to or closer to the rigidity of the side surface of the writing chamber 103 in which the opening 20 is not formed. The rib portion 10 is preferably formed to have the same width as that of the side surface 40 of the writing chamber 103 in which the opening 20 is formed.

Figure 3:
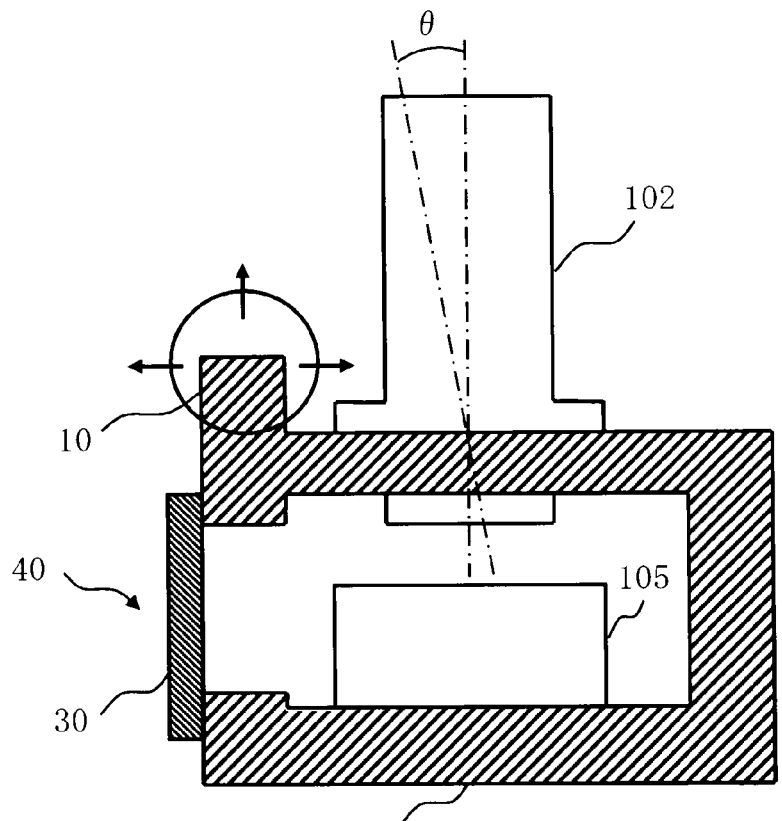
FIG. 3 is a conceptual diagram showing a section of a writing chamber according to Embodiment 1.

FIG. 3 is a conceptual diagram showing a section of the writing chamber according to Embodiment 1. As shown in FIG. 3, the rib portion 10 is preferably formed to have an upwardly convex shape or a horizontally convex shape. An example of the rib shape will be illustrated below.

Figure 4:
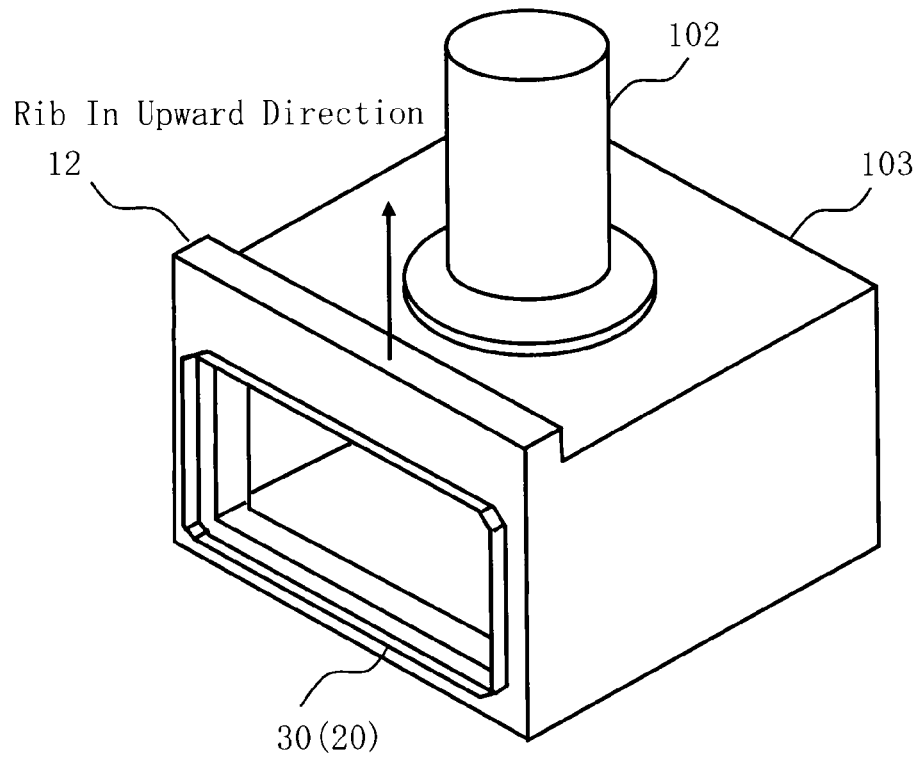
FIG. 4 is a diagram showing an example of an appearance of the lithography apparatus according to Embodiment 1.

FIG. 4 is a diagram showing an example of an appearance of the lithography apparatus according to Embodiment 1. FIG. 4 shows a case in which a rib portion 12 is formed to have a shape that is upwardly convex extending from the upper surface of the writing chamber 103. In FIG. 4, for example, a plate to be used as the side surface of the writing chamber 103 in which the opening 20 is formed is welded to upwardly project from the upper plate of the writing chamber 103.

Figure 5:
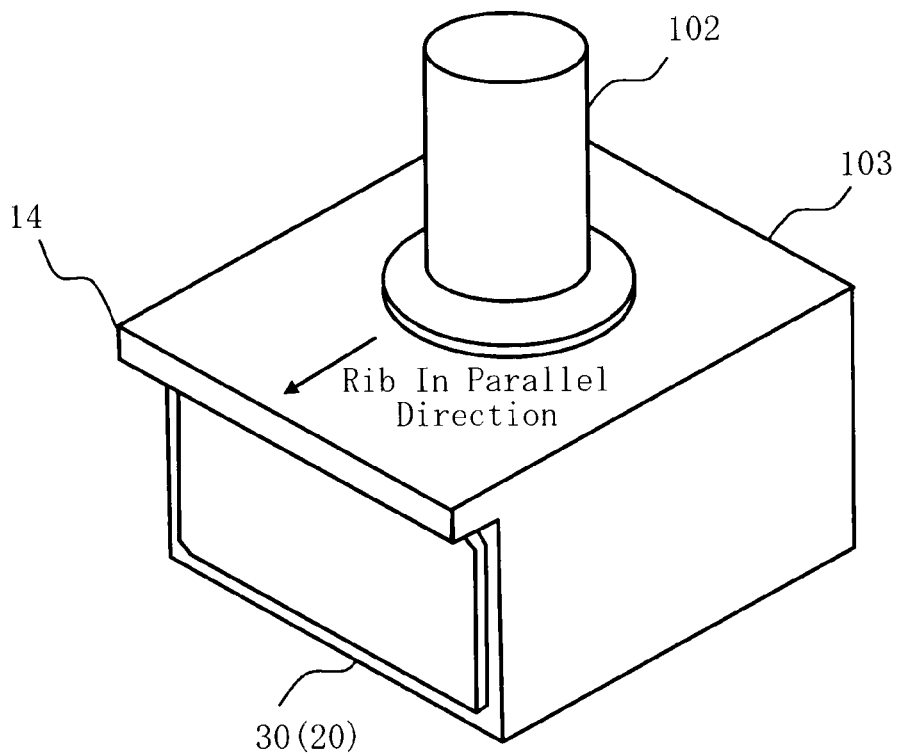
FIG. 5 is a diagram showing another example of the appearance of the lithography apparatus according to Embodiment 1.

FIG. 5 is a diagram showing another example of the appearance of the lithography apparatus according to Embodiment 1. FIG. 5 shows a case in which a rib portion 14 is formed to have a shape that is convex in a direction parallel to the upper surface of the writing chamber 103. In FIG. 5, for example, a plate to be used as the upper surface of the writing chamber 103 is welded to project from the side surface plate of the writing chamber 103 in which the opening 20 is formed to a side surface side to make it possible to form the rib portion 14.

Figure 6:
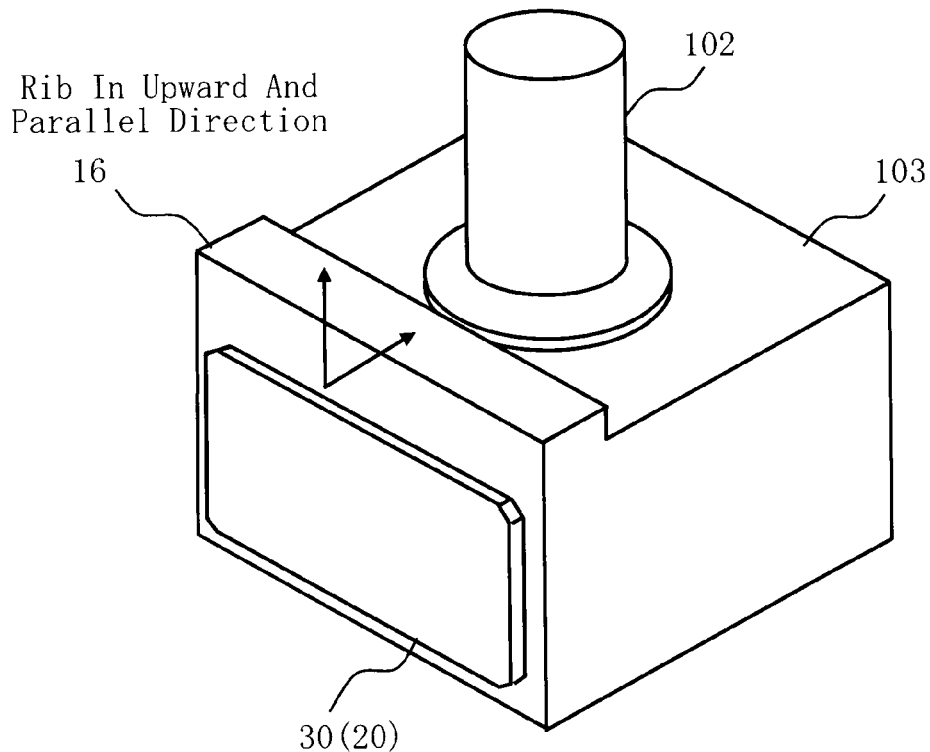
FIG. 6 is a diagram showing an example of the lithography apparatus according to Embodiment 1.

FIG. 6 is a diagram showing an example of the appearance of the lithography apparatus according to Embodiment 1. FIG. 6 shows an example in which a rib portion 16 is formed to have a shape that is upwardly convex extending from the upper surface of the writing chamber 103 and that is convex in a direction parallel to the upper surface of the writing chamber 103. In FIG. 6, a case in which the thickness of the rib portion 16 is increased toward the inside of the writing chamber 103 as the direction parallel to the upper surface of the writing chamber 103 is shown.

Figure 7:
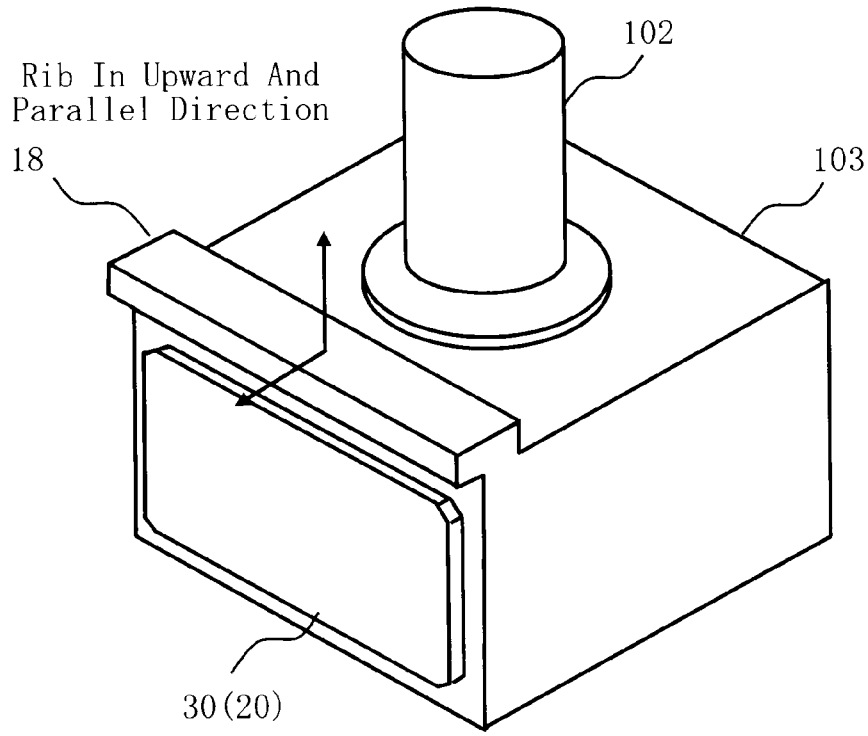
FIG. 7 is a diagram showing an example of the lithography apparatus according to Embodiment 1.

FIG. 7 is a diagram showing an example of the appearance of the lithography apparatus according to Embodiment 1. FIG. 7 shows another example in which a rib portion 18 is formed to have a shape that is upwardly convex extending from the upper surface of the writing chamber 103 and that is convex in a direction parallel to the upper surface of the writing chamber 103. In FIG. 7, a case in which the rib portion 16 is extended toward the outside of the writing chamber 103 as the direction parallel to the upper surface of the writing chamber 103 is shown.

Figure 8:
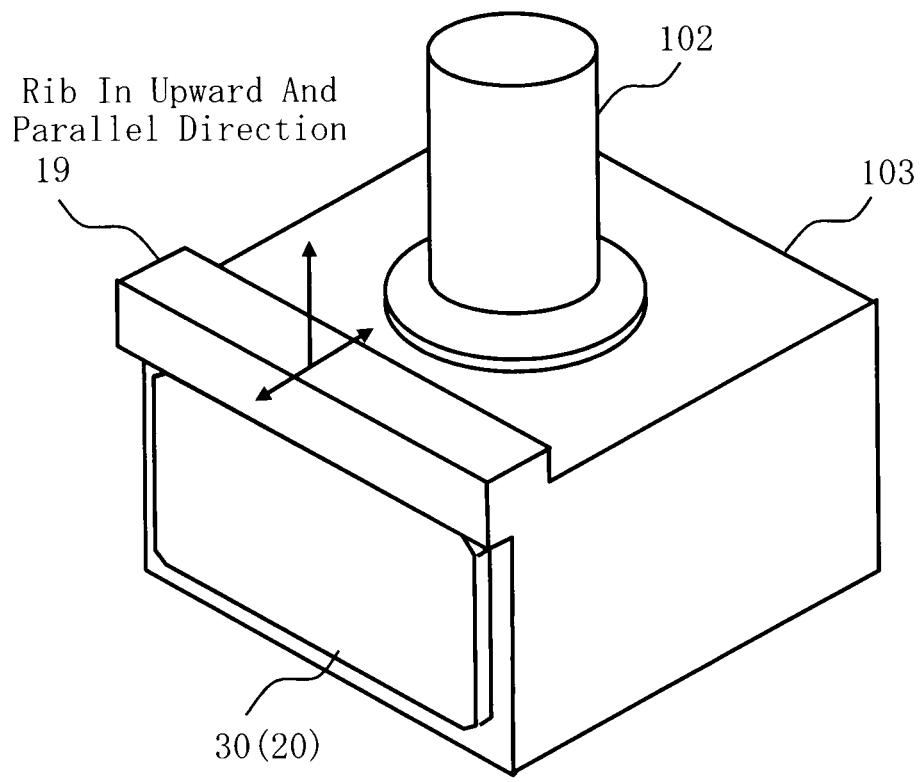
FIG. 8 is a diagram showing an example of the lithography apparatus according to Embodiment 1.

FIG. 8 is a diagram showing an example of the lithography apparatus according to Embodiment 1. FIG. 8 shows another example in which a rib portion 19 is formed to have a shape that is upwardly convex extending from the upper surface of the writing chamber 103 and that is convex in a direction parallel to the upper surface of the writing chamber 103. In FIG. 8, a case in which the rib portion 16 is extended toward both the outside and the inside of the writing chamber 103 as the direction parallel to the upper surface of the writing chamber 103 is shown.

By forming the rib portion in any of the shapes described above, the rigidity of the side surface of the writing chamber 103 in which the opening 20 is formed can be improved.

Figure 9:
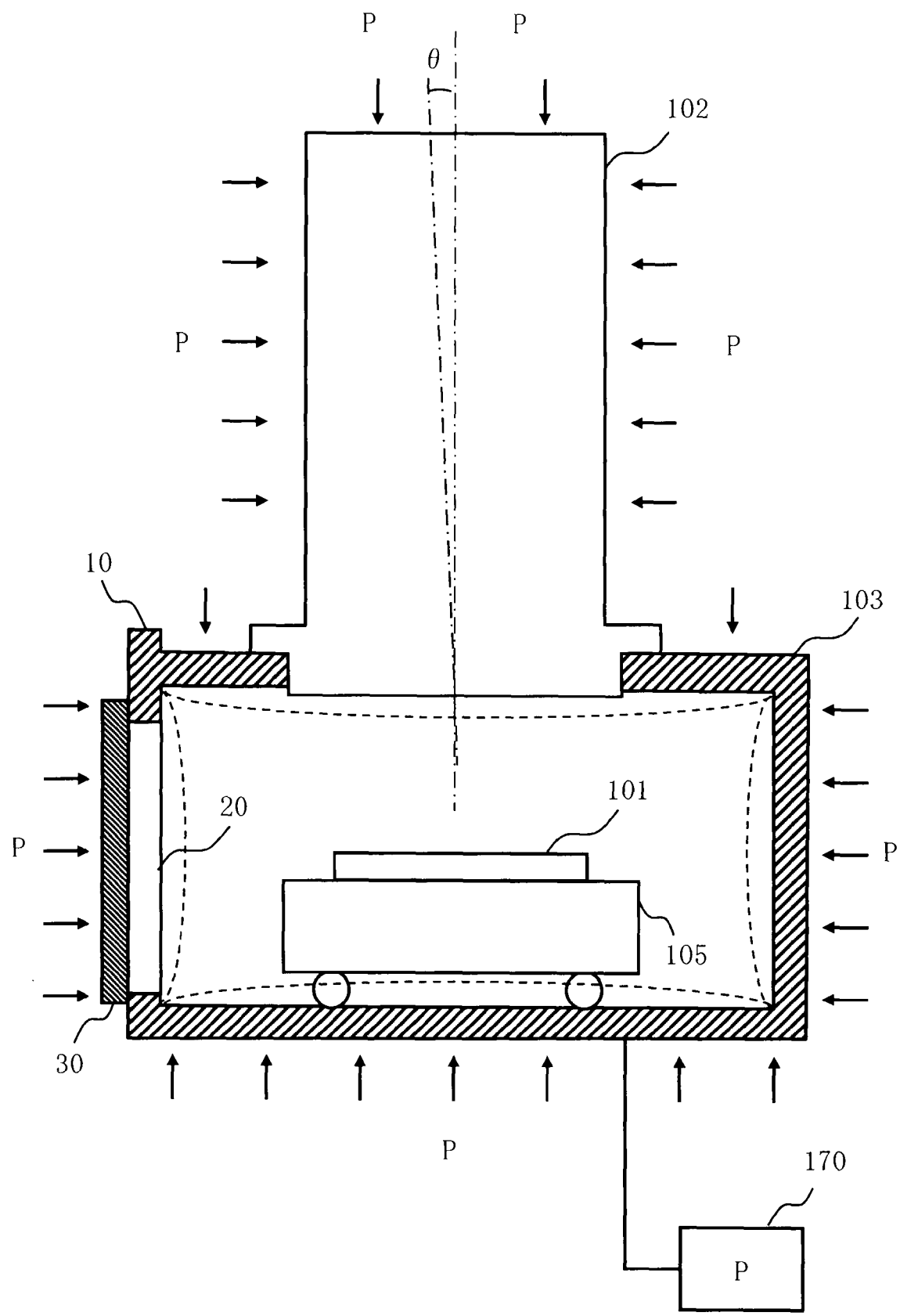
FIG. 9 is a conceptual diagram for explaining a state in which the writing chamber according to Embodiment 1 is vacuumed.
Figure 10:
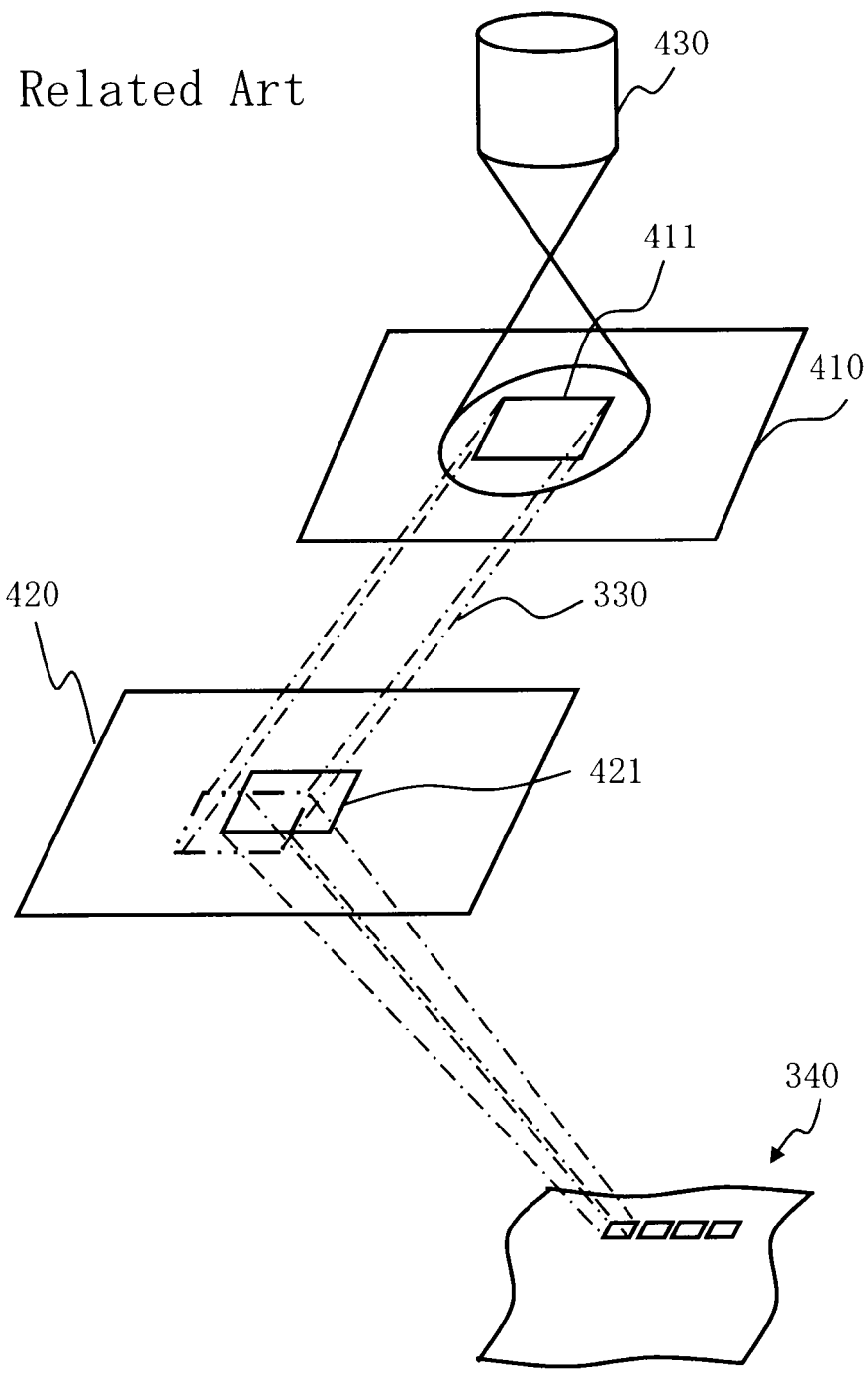
FIG. 10 is a conceptual diagram for explaining an operation of a variable-shaped exposure device.
Figure 11:
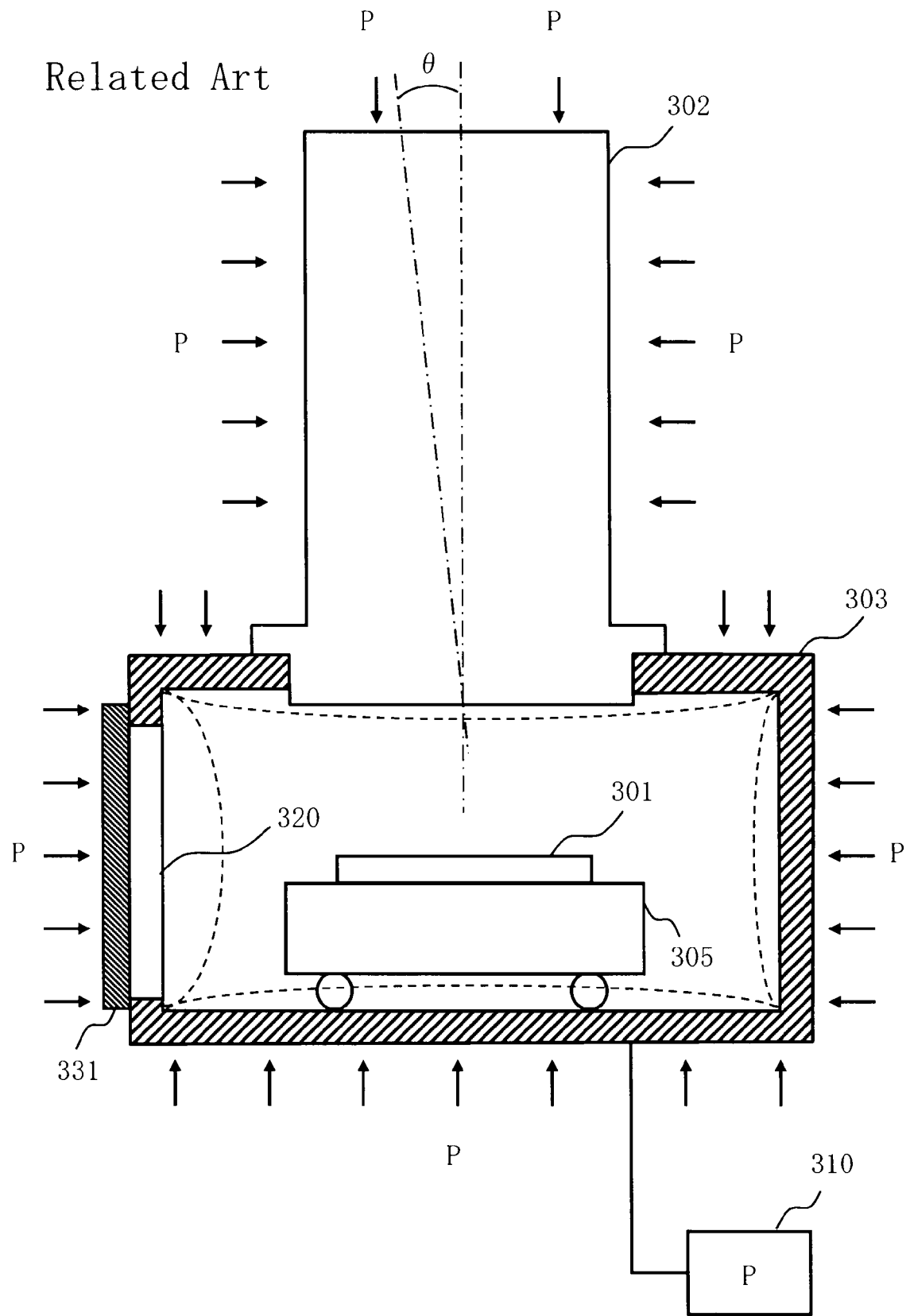
FIG. 11 is a conceptual diagram for explaining a housing configuration of the lithography apparatus.

FIG. 9 is a conceptual diagram for explaining a state in which the writing chamber according to Embodiment 1 is vacuumed. As described above, the rib portion 10 is integrally formed on the upper portion of the side surface of the writing chamber 103 in which the opening 20 is formed. In this manner, when the electro-optic lens barrel 102 and the writing chamber 103 are vacuumed with the vacuum pump 170, an amount of deformation of the side surface of the writing chamber 103 in which the opening 20 is formed can be made equal to or closer to an amount of deformation of the side surface of the writing chamber 103 in which the opening 20 is not formed in the vacuum state. As a result, amounts of deformation of both the side surfaces are balanced, and thus a tilt angle θ of the electro-optic lens barrel 102 can be reduced.

For example, in a conventional configuration in which a rib is not formed, a beam displacement of 25 nm is observed when a variation in atmosphere is 10 hPa. However, for example, in the example of the configuration shown in FIG. 4, the beam displacement can be suppressed to 15 nm. The size of the rib portion 10 is arbitrarily adjusted to make it possible to better balance the rigidities and to approximate the tilt angle θ of the electro-optic lens barrel 102 to 0. Furthermore, even when a variation in atmosphere occurs, a variation of the tilt angle θ of the electro-optic lens barrel 102 can be reduced. As a result, an error of a position of a beam irradiated on the target object 101 can be reduced, and thus writing accuracy can be improved.

After the writing chamber 103 reinforced by the rib portion 10 as described above and the electro-optic lens barrel 102 are controlled to be a vacuum state by exhausting in the electro-optic lens barrel 102 and the writing chamber 103, a writing operation is started in the vacuum state. A concrete operation will be explained below.

The electron beam 200 emitted from the electron gun assembly 201 illuminates the entire first aperture plate 203 having an oblong, for example, a rectangular hole by the illumination lens 202. In this case, the electron beam 200 is firstly shaped into an oblong, for example, a rectangle. The electron beam 200 of the first aperture plate image having passed through the first aperture plate 203 is projected on the second aperture plate 206 by the projection lens 204. A position of the first aperture plate image on the second aperture plate 206 is controlled by the deflector 205 so that a beam shape and a beam size can be changed. The electron beam 200 of the second aperture plate image having passed through the second aperture plate 206 is focused by the objective lens 207, deflected by the deflector 208, and irradiated on a desired position of the target object 101 on the X-Y stage 105 which can be movably arranged.

The embodiment has been described with reference to the concrete examples. However, the present invention is not limited to the concrete example.

Although parts such as an apparatus configuration and a control method which are not directly required for the explanation of the present invention are not described, a required apparatus configuration or a required control method can be arbitrarily selected and used. For example, although a configuration of a control unit which controls the lithography apparatus 100 is not described, a required control unit configuration can be arbitrarily selected and used as a matter of course.

All lithography apparatuses and position measuring methods which include the elements of the present invention and can be arbitrarily changed in design by a person skilled in the art are included in the spirit and scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A lithography apparatus comprising:
a stage on which a target object is placed;
a chamber in which the stage is arranged and which has at least one side surface in which an opening having a size which is enough to carry the stage in or out is formed and at least one side surface in which an opening is not formed, the opening being closed with an independent lid;
an electro-optic lens barrel arranged on the chamber; and
at least one rib portion formed to have a shape that is convex on an upper portion of each of the at least one side surface of the chamber in which the opening is formed, the rib portion being formed integrally with the chamber, as an integral extension of the at least one side surface of the chamber in which the opening is formed, to increase rigidity of the at least one side surface of the chamber,
wherein the chamber has four side surfaces, and the at least one rib portion is formed along a whole border line between the each of the at least one side surface, in which the opening is formed, of the four side surfaces of the chamber and an upper surface of the chamber;
wherein the rib portion does not surround the opening.

2. The apparatus according to claim 1, wherein the rib portion is formed to have a shape that is upwardly convex and extending from the upper surface of the chamber.

3. The apparatus according to claim 1, wherein the rib portion is formed to have a convex shape in a direction parallel to the upper surface of the chamber.

4. The apparatus according to claim 1, wherein the rib portion is formed to have a shape that is upwardly convex extending from the upper surface of the chamber and that is convex in a direction parallel to the upper surface of the chamber.

5. The apparatus according to claim 1, wherein the rib portion is formed to have a same width as that of the one side surface of the chamber in which the opening is formed.

6. The apparatus according to claim 1, wherein the rib portion is arranged at a position not to be in contact with the electro-optic lens barrel.

7. The apparatus according to claim 6, wherein the rib portion is made of a plate-like member.

8. The apparatus according to claim 1, wherein
the chamber has a plurality of side surfaces, and
a rigidity of the side surface in which the rib portion is formed is made equal to that of an opposite side surface in which the rib portion is not formed.

9. A lithography method comprising:
controlling a vacuum state in a chamber having at least one side surface in which an opening is formed and at least one side surface in which an opening is not formed, each of the at least one side surface in which an opening is formed being reinforced by a rib portion, and an electro-optic lens barrel arranged on the chamber, wherein the chamber has four side surfaces, and the rib portion is formed along a whole border line between the each of the at least one side surface, in which the opening is formed, of the four side surfaces of the chamber and an upper surface of the chamber; the rib portion being formed integrally with the chamber, as an integral extension of the at least one side surface of the chamber in which the opening is formed, to increase rigidity of the one side surface of the chamber, and
irradiating a charged particle beam from the electro-optic lens barrel to a target object placed on a stage arranged in the chamber in the vacuum state to form a pattern;
wherein the rib portion does not surround the opening.

10. The method according to claim 9, further comprising:
reinforcing the side surface by using the rib portion such that an amount of deformation of the side surface in which the opening is formed is equal to that of an opposite side surface in which the opening is not formed in the vacuum state.

11. The method according to claim 9, wherein the rib portion is formed to have a shape that is upwardly convex and extending from the upper surface of the chamber.

12. The method according to claim 9, wherein the rib portion is formed to have a convex shape in a direction parallel to the upper surface of the chamber.

13. The method according to claim 9, wherein the rib portion is formed to have a shape that is upwardly convex extending from the upper surface of the chamber and that is convex in a direction parallel to the upper surface of the chamber.

14. The method according to claim 9, wherein the rib portion is formed to have a same width as that of the one side surface of the chamber in which the opening is formed.

15. The method according to claim 9, wherein the rib portion is arranged at a position not to be in contact with the electro-optic lens barrel.

16. The method according to claim 15, wherein the rib portion is made of a plate-like member.

17. The method according to claim 9, wherein the rib portion has a same width as that of a plate to be used as the side surface of the chamber.

18. The apparatus according to claim 1, wherein the rib portion has a same width as that of a plate to be used as the side surface of the chamber.

* * * * *